(12) United States Patent
Banna et al.

(10) Patent No.: US 8,956,886 B2
(45) Date of Patent: Feb. 17, 2015

(54) EMBEDDED TEST STRUCTURE FOR TRIMMING PROCESS CONTROL

(71) Applicant: Applied Materials, Inc., Santa Clara, CA (US)

(72) Inventors: Samer Banna, San Jose, CA (US); Olivier Joubert, Meylan (FR); Lei Lian, Fremont, CA (US); Maxime Darnon, Gières (FR); Nicolas Posseme, Carantec (FR); Laurent Vallier, Montbonnot St Martin (FR)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/204,668

(22) Filed: Mar. 11, 2014

(65) Prior Publication Data
US 2014/0273297 A1 Sep. 18, 2014

Related U.S. Application Data

(60) Provisional application No. 61/785,753, filed on Mar. 14, 2013.

(51) Int. Cl.
| | | |
|---|---|---|
| H01L 21/00 | (2006.01) | |
| H01L 21/66 | (2006.01) | |
| H01L 21/311 | (2006.01) | |
| H01L 21/027 | (2006.01) | |
| H01L 21/67 | (2006.01) | |
| H01L 21/308 | (2006.01) | |
| H01L 21/3213 | (2006.01) | |
| G03F 7/20 | (2006.01) | |

(52) U.S. Cl.
CPC .......... *H01L 22/26* (2013.01); *H01L 21/31144* (2013.01); *H01L 21/0273* (2013.01); *H01L 21/67253* (2013.01); *H01L 21/3086* (2013.01); *H01L 22/20* (2013.01); *H01L 21/32139* (2013.01); *G03F 7/70625* (2013.01)
USPC ........ 438/7; 438/8; 438/14; 438/16; 438/736; 257/E21.314; 430/312

(58) Field of Classification Search
CPC ... H01L 22/20; H01L 22/26; H01L 21/31144; H01L 21/32139; H01L 21/0273; H01L 21/67253; H01L 21/0337; H01L 21/311138; G03K 7/70625
USPC .............................. 438/7, 8, 14, 16, 736, 717; 257/E21.314, E21.038; 430/312, 313, 430/316
See application file for complete search history.

(56) References Cited

U.S. PATENT DOCUMENTS

| | | | | |
|---|---|---|---|---|
| 6,448,097 B1 * | 9/2002 | Singh et al. | ..................... | 438/16 |
| 6,630,361 B1 * | 10/2003 | Singh et al. | ....................... | 438/7 |

(Continued)

*Primary Examiner* — Michael Trinh
(74) *Attorney, Agent, or Firm* — Moser Taboada; Alan Taboada

(57) ABSTRACT

In some embodiments, a method of controlling a photoresist trimming process in a semiconductor manufacturing process may include forming a photoresist layer atop a first surface of a substrate, wherein the photoresist layer comprises a lower layer having a first pattern to be etched into the first surface of the substrate, and an upper layer having a second pattern that is not etched into the first surface of the substrate; trimming the photoresist layer in a direction parallel to the first surface of the substrate; measuring a trim rate of the second pattern using an optical measuring tool during the trimming process; and correlating the trim rate of the second pattern to a trim rate of the first pattern to control the trim rate of the first pattern during the trimming process.

20 Claims, 3 Drawing Sheets

(56) References Cited

U.S. PATENT DOCUMENTS

| | | | |
|---|---|---|---|
| 6,884,727 B2* | 4/2005 | Zhang et al. | ................ 438/694 |
| 6,924,191 B2 | 8/2005 | Liu et al. | |
| 6,960,416 B2 | 11/2005 | Mui et al. | |
| 7,261,745 B2* | 8/2007 | Gibson, Jr. | ................ 29/25.01 |
| 7,431,795 B2 | 10/2008 | Kumar et al. | |
| 8,257,546 B2* | 9/2012 | Davis et al. | ............. 156/345.25 |

* cited by examiner

EMBEDDED TEST STRUCTURE FOR TRIMMING PROCESS CONTROL

FIELD

Embodiments of the present invention generally relate to semiconductor substrate processing systems. More specifically, the present invention relates to process control during photoresist plasma trimming processes in a semiconductor substrate processing system.

BACKGROUND

Fabrication of semiconductor features, such as 3D NAND staircase features, requires precise control of multiple steps of photoresist trimming and material etching. In particular, for photoresist trimming, precise control of the trimming time is required to meet targeted dimensions of the photoresist. A lack of process stability and reproducibility results in small chamber condition drift, leading to trim rate variations that are difficult to measure and compensate for. Standard endpoint detection techniques, such as optically measuring the variation of the thickness of etched material within a reactor to determine an endpoint for a material etching process, are ineffective for controlling a photoresist trimming process.

Accordingly, the inventors have provided improved photoresist plasma trimming processes in a semiconductor substrate processing system.

SUMMARY

Methods for controlling a trimming process in a semiconductor manufacturing process are provided herein. In some embodiments, a method of controlling a photoresist trimming process in a semiconductor manufacturing process may include forming a photoresist layer atop a first surface of a substrate, wherein the photoresist layer comprises a lower layer formed atop the first surface and having a first pattern to be etched into the first surface of the substrate, and an upper layer having a second pattern that is not etched into the first surface of the substrate; trimming the photoresist layer in a direction parallel to the first surface of the substrate; measuring a trim rate of the second pattern using an optical measuring tool during the trimming process; and correlating the trim rate of the second pattern to a trim rate of the first pattern to control the trim rate of the first pattern during the trimming process.

In some embodiments, a method of forming a 3D NAND staircase structure may include (a) forming a photoresist layer atop a first surface of a substrate, wherein the photoresist layer comprises: a lower layer formed atop the first surface of the substrate and having a first pattern to be etched into the first surface of the substrate, and an upper layer having a second pattern that is not etched into the first surface of the substrate; (b) etching the first pattern into the first surface of the substrate to a desired depth; (c) trimming the photoresist layer in a direction parallel to the first surface of the substrate; (d) measuring a trim rate of the second pattern using an optical measuring tool during the trimming process; (e) correlating the trim rate of the second pattern to a trim rate of the first pattern to control the trim rate of the first pattern during the trimming process; (f) repeating steps (b)-(c) to etch the first surface of the substrate to a desired depth.

In some embodiments, a method of controlling a photoresist trimming process in a semiconductor manufacturing process may include forming a photoresist layer atop a first surface of a substrate, wherein the photoresist layer comprises a lower layer formed atop the first surface of the substrate and having a first pattern to be etched into the first surface of the substrate, and an upper layer having a second pattern that is not etched into the first surface of the substrate, wherein the second pattern comprises a plurality of resist structures defining a space between each individual resist structure; trimming the photoresist layer in a direction parallel to the first surface of the substrate; measuring a trim rate of the second pattern during the trimming process by shining a beam of light at the second pattern, detecting a reflected beam of light off of the second pattern, and analyzing the reflected beam of light off of the second pattern to determine the trim rate of the first pattern; and correlating the trim rate of the second pattern to a trim rate of the first pattern to control the trim rate of the first pattern during the trimming process.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
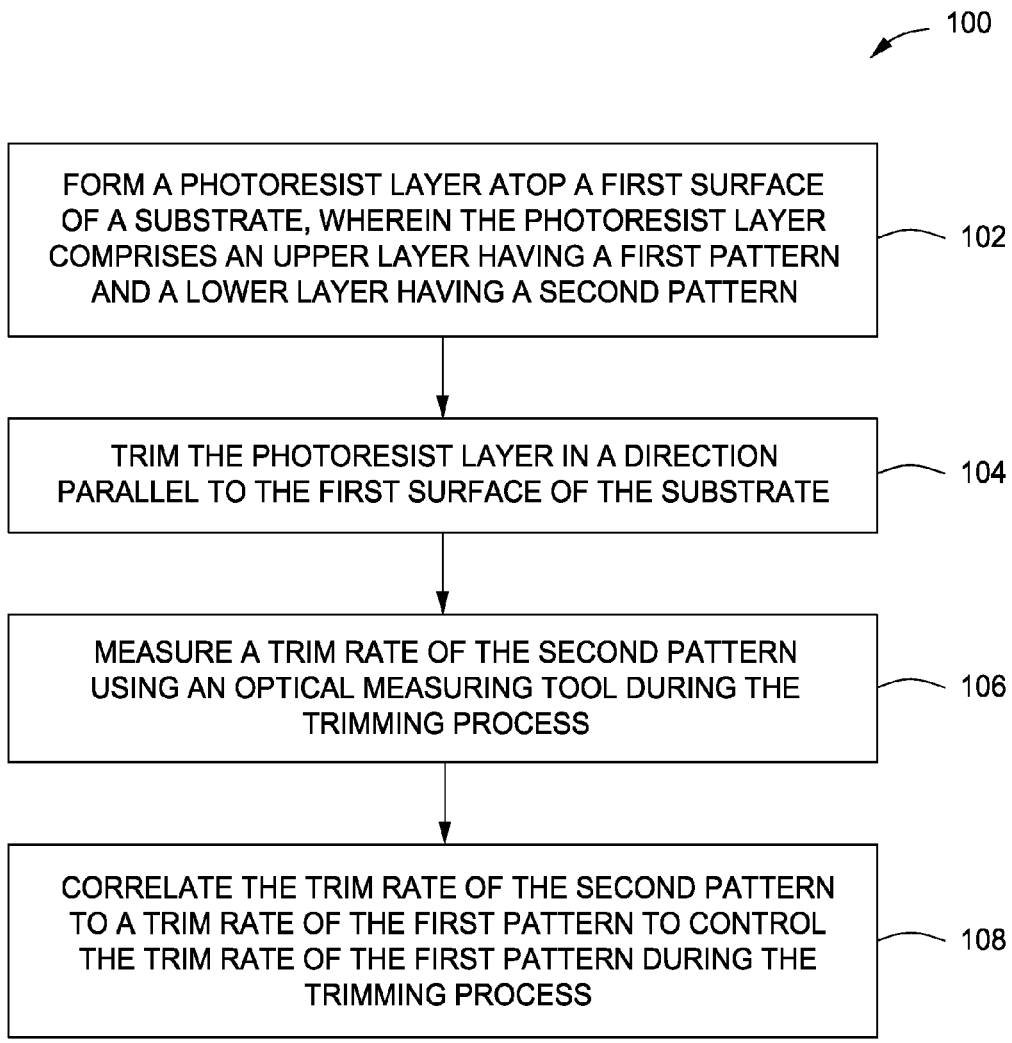
FIG. 1 depicts a flow chart of a method for controlling a photoresist trimming process in a semiconductor manufacturing process in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods for controlling a photoresist trimming process in a semiconductor manufacturing process are provided herein. Embodiments of the present invention may advantageously allow for in-situ measurement of the photoresist trim rate without needing to account for small amounts of drift in the process chamber condition.

FIG. 1 depicts a flow chart of a method 100 for controlling a photoresist trimming process in a semiconductor manufacturing process in accordance with some embodiments of the present invention. The method 100 is described herein with respect to the structure depicted in FIGS. 2A-2E and may be performed, for example, in a suitable reactor, such as is described below with respect to FIG. 3.

Figure 2A:
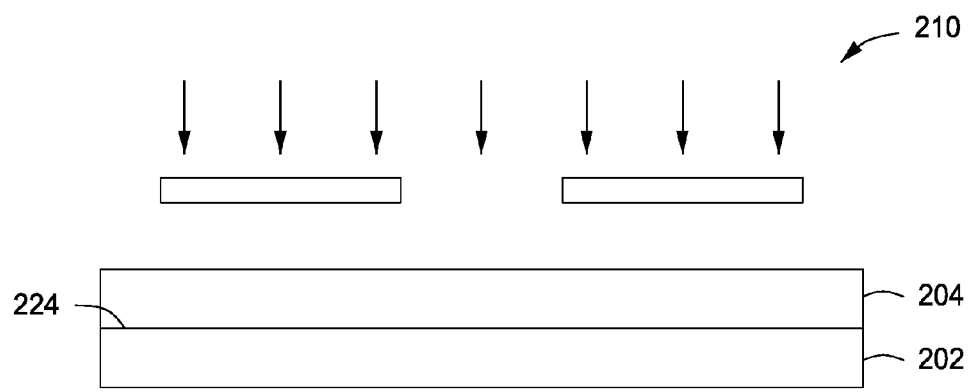
FIGS. 2A-2E depict stages of fabrication of a photoresist structure in accordance with some embodiments of the present invention.

The method 100 of controlling a photoresist trimming process in a semiconductor manufacturing process begins at 102, as depicted in FIG. 2A, by forming a photoresist layer 204 atop a first surface 224 of a substrate 202. The substrate 202 may comprise any suitable material used in the fabrication of semiconductor devices. For example, in some embodiments, the substrate 202 may comprise a semiconducting material and/or combinations of semiconducting materials and non-semiconductive materials for forming semiconductor structures and/or devices. For example, the substrate 202 may comprise one or more silicon-containing materials such as crystalline silicon (e.g., Si<100> or Si<111>), strained silicon, polysilicon, germanium, silicon germanium, or the like. The substrate 202 may further have any desired geometry, such as a 200 or 300 mm wafer, square or rectangular panels, or the like. In some embodiments, the substrate 202 may be a semiconductor wafer (e.g., a 200 mm, 300 mm, or the like silicon wafer).

Figure 2B:
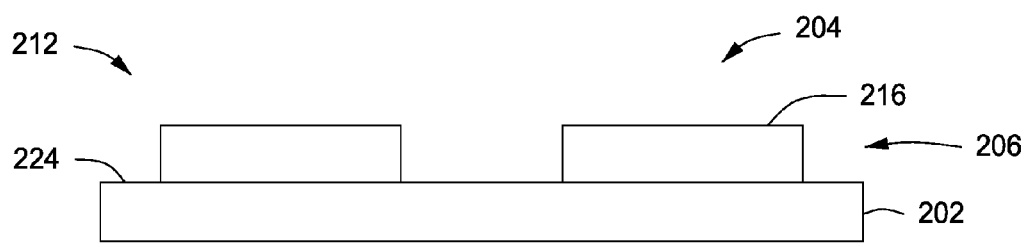
Figure 2C:
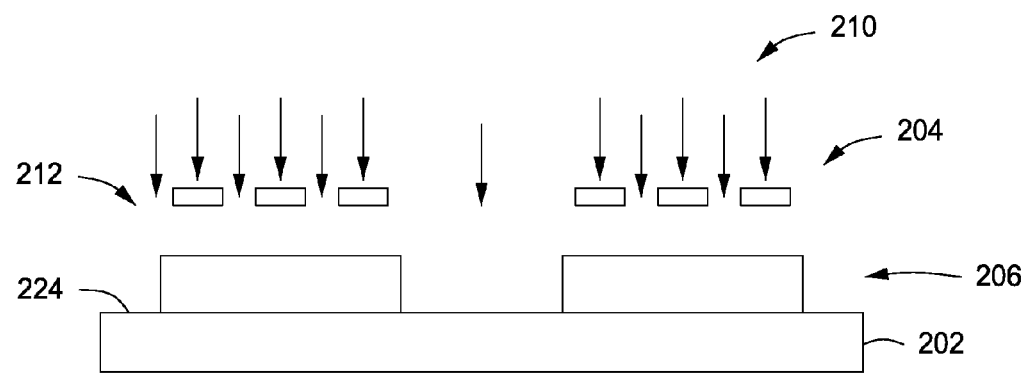
Figure 2D:
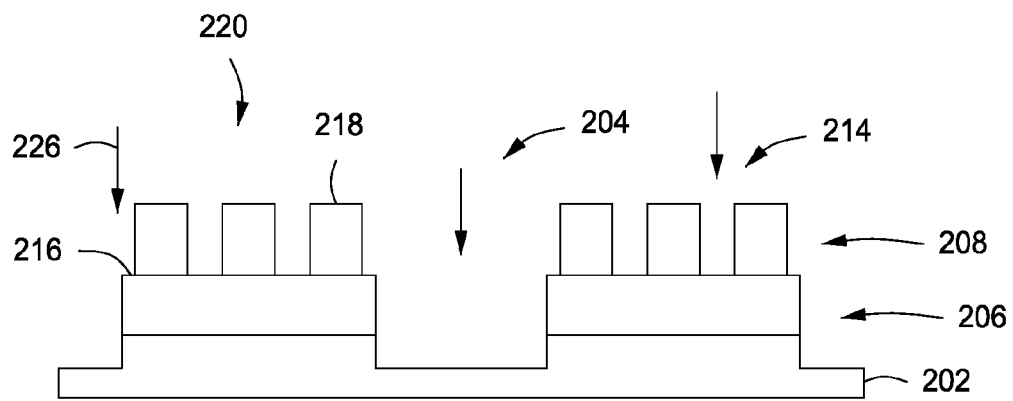

The photoresist layer 204 may comprise any suitable photoresist, such as a positive or negative photoresist that may be formed and patterned in any suitable manner, for example, via optical lithography techniques. In some embodiments, as depicted in FIG. 2B, the photoresist layer 204 comprises a lower layer 206 formed atop the first surface 224 of the substrate 202 and having a first pattern 212. The first pattern 212 is a pattern to be etched into the first surface 224 of the substrate 202. As depicted in FIG. 2D, the photoresist layer 204 comprises an upper layer 208 having a second pattern 214. The second pattern 214 is a dummy pattern that is not to be etched into the first surface 224 of the substrate 202. In some embodiments, the second pattern 214 comprises a plurality of resist structures 218 defining a space 220 between each individual resist structure 218.

The upper layer 208 is formed atop the lower layer 206, advantageously minimizing the loss of wafer surface area to the formation of the second pattern 214 as compared to providing sacrificial process measurement features directly on the substrate. In some embodiments, the upper layer 208 is formed atop a portion of the upper surface 216 of the lower layer 206 that is aligned with an optical measuring tool, for example as described below with respect to FIG. 3. In some embodiments, the upper layer 208 is formed atop an entire upper surface 216 of the lower layer 206, advantageously avoiding the need for precise alignment with the optical measuring tool.

In some embodiments, the lower layer 206 and the upper layer 208 of the photoresist layer 204 may be the same photoresist material. In such embodiments, as depicted in FIG. 2A, portions of a photoresist layer 204 may be exposed to ultraviolet (UV) light 210 followed by development of the photoresist layer 204 to remove the exposed portions of the photoresist layer 204. As depicted in FIG. 2B, removing the exposed portions of the photoresist layer 204 forms a lower layer 206 having a first pattern 212. In some embodiments, as depicted in FIG. 2C, an upper surface 216 of the lower layer 206 is exposed to ultraviolet light 210 followed by development of the upper surface 216 of the lower layer 206 to remove the exposed portions of the lower layer 206. As depicted in FIG. 2D, removing the exposed portions of the lower layer 206 forms the upper layer 208 having a second pattern 214.

In some embodiments, the lower layer 206 and the upper layer 208 of the photoresist layer 204 may be different photoresist materials. In some embodiments, where the lower layer 206 and the upper layer 208 of the photoresist layer 204 are different photoresist materials, a first photoresist material layer is applied to the first surface 224 of substrate 202. Portions of the first photoresist material layer may be exposed to ultraviolet light followed by development of the first photoresist material layer to remove the exposed portions of the first photoresist material layer and form a lower layer 206 having a first pattern 212. The lower layer 206 is cross-linked prior to forming the upper layer 208, for example by freezing or by the application of ultraviolet light, to harden the lower layer 206 without cross-linking, or hardening, the upper layer 208. A second photoresist material layer is applied to the hardened upper surface 216 of the lower layer 206. Portions of the second photoresist material may be exposed to ultraviolet light followed by development of the second photoresist material to remove the exposed portions of the second photoresist material and form an upper layer 208 having a second pattern 214.

In some embodiments, where the photoresist layer 204 comprises two different photoresist materials, the first photoresist material of the lower layer 206 is opaque to light having a first wavelength and the second photoresist material of the upper layer 208 is optically transparent to light having a second wavelength different than the first to advantageously allow for the optical measurement of the dimensions of the second pattern 214 without interference by the underlying lower layer 206.

Figure 2E:
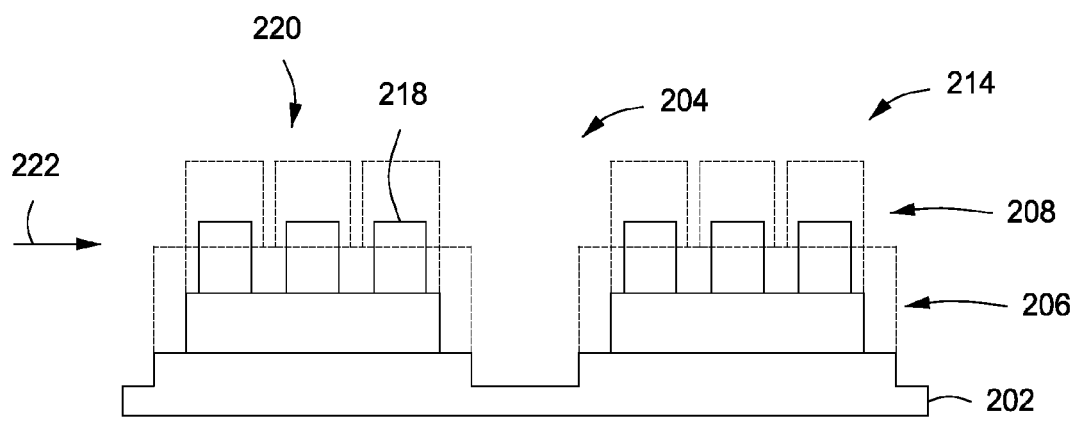

Next, at 104, and as depicted in FIG. 2E, the photoresist layer 204 is trimmed in a direction parallel to the first surface 224 of the substrate 202. The photoresist layer 204 is trimmed using a trimming plasma 222 to trim the upper layer 208 and the lower layer 206 in a direction parallel to the first surface 224 of the substrate.

The inventors have observed that standard endpoint detection techniques are not effective for satisfactorily controlling the trimming rate of the lower layer 206. Control of the trim rate of the lower layer 206, which is etched into the first surface 224 of the substrate 202, is necessary to meet the targeted dimensions of certain semiconductor features. The inventors have observed that the trim rate of an upper layer 208 formed atop the lower layer 206 can be measured by standard endpoint detection techniques, such as scatterometry, and then correlated to the trim rate of the lower layer 206, advantageously enabling an in-situ determination of the trim rate of the lower layer 206. As a result, at 106, a trim rate of the second pattern 214 is measured using an optical measuring tool during the trimming process and, at 108, the trim rate of the second pattern 214 is correlated to a trim rate of the first pattern 212 to control the trim rate of the first pattern during the trimming process.

Figure 3:
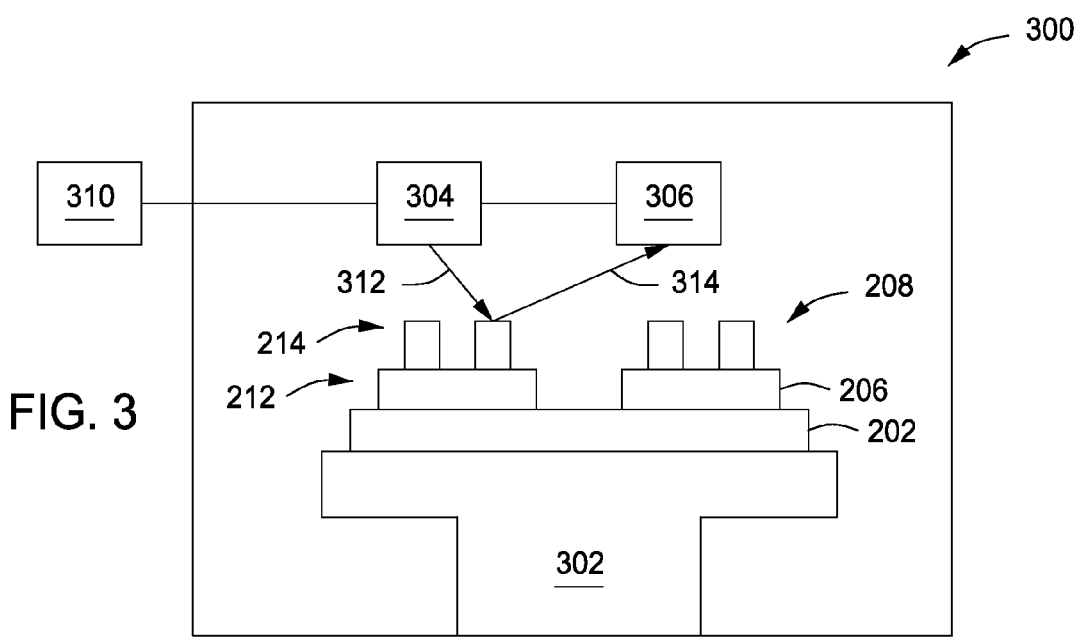
FIG. 3 depicts a process chamber suitable for carrying out embodiments of the present invention.

The trim rate of the second pattern 214 may be measured and correlated to a trim rate of the first pattern 212 in a suitable process chamber, for example, the process chamber depicted in FIG. 3. FIG. 3 is a schematic view of a substrate processing chamber (process chamber 300) in accordance with some embodiments of the present invention. The process chamber 300 may be any type of chamber, for example an etch chamber, such as, but not limited to, the Enabler™, MxP®, MxP+™, Super-E™, DPS II AdvantEdge™ G3, or E-MAX® chambers manufactured by Applied Materials, Inc., located in Santa Clara, Calif. Other process chambers, including those from other manufacturers, may similarly benefit from use of the methods as described herein.

The process chamber 300 generally comprises a substrate support 302 for supporting the substrate 202 in a desired position to reflect a beam of light 312 provided by a light source 304 off of the second pattern 214, such that a light detector 306 can detect the reflected beam of light 314. A controller 310 is coupled to the light source 304 and the light detector 306 and receives data from the light detector 306 from which the trim rate of the first pattern 212 can be determined.

A beam of light 312 is shone upon a reflective surface of the second pattern 214. The beam of light is shone from a light source disposed above the substrate 202, such as the light source 304 depicted in FIG. 3. The light source 304 may comprise any suitable light source for providing a focused beam of light that may be directed towards and may reflect off of the reflective surface of the second pattern 214. In some embodiments, the light source 304 may comprise a laser, one or more light-emitting diodes (LED), or the like. It is contemplated that the light source 304 may comprise other components (e.g., light producing elements, light collimating elements, mirrors, or the like) that may be capable of forming and directing a beam of light.

The beam of light reflected off of the reflective surface of the second pattern 214 is detected. The reflected beam of light 314 may be detected by a light detector positioned to receive the reflected beam of light 314, such as the light detector 306 depicted in FIG. 3. In some embodiments, the light detector 306 may comprise any suitable sensor for detecting the reflected beam of light, such as a photodiode, or the like. The detected reflected beam of light 314 is analyzed, for example by a controller 310, to determine the trim rate of the first pattern 212 based on the change in the space 220 between resist structures 218 of the upper layer 208.

In some embodiments, in-situ measurement of the photoresist trim rate advantageously allows for the formation of a 3D NAND structure. The formation of a 3D NAND structure begins, as described above at 102, by the formation of a photoresist layer 204 atop a first surface 224 of a substrate, wherein the photoresist layer 204 comprises a lower layer 206 formed atop the first surface 224 of the substrate 202 and having a first pattern 212 to be etched into the first surface 224 of the substrate 202 and an upper layer 208 having a second pattern 214 that is not etched into the first surface 224 of the substrate 202. Following the formation of the lower layer 206 and the upper layer 208, the first pattern 212 is etched into the first surface 224 of the substrate 202 to a desired depth. In some embodiments, as depicted in FIG. 2D, the first pattern 212 can be etched by using an etching plasma 226 suitable for etching the first surface 224 of the substrate 202.

Next, as described above at 104 and depicted in FIG. 2E, the photoresist layer 204 is trimmed in a direction parallel to the first surface 224 of the substrate 202. Next, as described above at 106 and 108, the trim rate of the second pattern 214 is measured using an optical measuring tool during the trimming process and is then correlated to a trim rate of the first pattern 212 to control the trim rate of the first pattern 212 during the trimming process. Once the trim rate of the second pattern 214 is correlated to the trim rate of the first pattern 212, the steps of etching the trimmed first pattern 212 into the first surface 224 of the substrate 202 and trimming the photoresist layer 204 in a direction parallel to the first surface 224 of the substrate 202 can be repeated to etch the first surface 224 of the substrate 202 to a desired depth.

Thus, methods for controlling a photoresist trimming process in a semiconductor manufacturing process are provided herein. The inventive method advantageously allows for in-situ measurement of the photoresist trim rate without needing to account for small amounts of drift in process chamber condition.

While the foregoing is directed to embodiments of the present invention, other and further embodiments of the invention may be devised without departing from the basic scope thereof.

The invention claimed is:

1. A method for controlling a photoresist trimming process in a semiconductor manufacturing process, comprising:
    forming a photoresist layer atop a first surface of a substrate, wherein the photoresist layer comprises
        a lower layer formed atop the first surface of the substrate and having a first pattern to be etched into the first surface of the substrate, and
        an upper layer having a second pattern that is not etched into the first surface of the substrate;
    trimming the photoresist layer in a direction parallel to the first surface of the substrate;
    measuring a trim rate of the second pattern using an optical measuring tool during the trimming process; and
    correlating the trim rate of the second pattern to a trim rate of the first pattern to control the trim rate of the first pattern during the trimming process.

2. The method of claim 1, comprising forming the upper layer either atop an entire upper surface of the lower layer or atop a portion of the upper surface of the lower layer aligned with the optical measuring tool.

3. The method of claim 1, further comprising etching the first pattern into the first surface of the substrate.

4. The method of claim 1, wherein the optical measuring tool employs scatterometry as an optical measuring technique.

5. The method of claim 1, wherein the upper layer is comprised of the same material as the lower layer.

6. The method of claim 1, wherein the upper layer is comprised of a different material than the lower layer.

7. The method of claim 6, further comprising exposing the lower layer to UV light prior to forming the upper layer to cross-link the lower layer without cross-linking the upper layer.

8. The method of claim 7, wherein the upper layer is optically transparent to light having a first wavelength and the lower layer is opaque to light having a second wavelength.

9. The method of claim 8, wherein the first wavelength is different than the second wavelength.

10. The method of claim 1, wherein trimming the photoresist layer further comprises forming a plasma to trim the upper layer and the lower layer in a direction parallel to the first surface of the substrate.

11. The method of claim 1, wherein the second pattern comprises a plurality of resist structures defining a space between each individual resist structure.

12. The method of claim 11, wherein measuring the trim rate of the second pattern further comprises:
    shining a beam of light at the second pattern;
    detecting a reflected beam of light off of the second pattern; and
    analyzing the reflected beam of light off of the second pattern to determine the trim rate of the first pattern.

13. A method of forming a 3D NAND staircase structure, comprising:
    (a) forming a photoresist layer atop a first surface of a substrate, wherein the photoresist layer comprises:
        a lower layer formed atop the first surface of the substrate and having a first pattern to be etched into the first surface of the substrate, and
        an upper layer having a second pattern that is not etched into the first surface of the substrate;
    (b) etching the first pattern into the first surface of the substrate to a desired depth;
    (c) trimming the photoresist layer in a direction parallel to the first surface of the substrate;
    (d) measuring a trim rate of the second pattern using an optical measuring tool during the trimming process;
    (e) correlating the trim rate of the second pattern to a trim rate of the first pattern to control the trim rate of the first pattern during the trimming process; and
    (f) repeating steps (b)-(c) to etch the first surface of the substrate to a desired depth.

14. The method of claim 13, comprising forming the upper layer either atop an entire upper surface of the lower layer or atop a portion of the upper surface of the lower layer aligned with the optical measuring tool.

15. The method of claim 13, wherein the upper layer is comprised of the same material as the lower layer.

16. The method of claim 13, wherein the upper layer is comprised of a different material than the lower layer.

17. The method of claim 16, comprising exposing the lower layer to UV light prior to forming the upper layer to cross-link the lower layer without cross-linking the upper layer.

18. The method of claim 13, wherein the second pattern comprises a plurality of resist structures defining a space between each individual resist structure.

19. The method of claim 18, wherein measuring the trim rate of the second pattern further comprises:
    shining a beam of light at the second pattern;
    detecting a reflected beam of light off of the second pattern; and
    analyzing the reflected beam of light off of the second pattern to determine the trim rate of the first pattern.

20. A method for controlling a photoresist trimming process in a semiconductor manufacturing process, comprising:
    forming a photoresist layer atop a first surface of a substrate, wherein the photoresist layer comprises:
        a lower layer formed atop the first surface of the substrate and having a first pattern to be etched into the first surface of the substrate, and
        an upper layer having a second pattern that is not etched into the first surface of the substrate, wherein the second pattern comprises a plurality of resist structures defining a space between each individual resist structure;
    trimming the photoresist layer in a direction parallel to the first surface of the substrate;
    measuring a trim rate of the second pattern during the trimming process by shining a beam of light at the second pattern, detecting a reflected beam of light off of the second pattern, and analyzing the reflected beam of light off of the second pattern to determine the trim rate of the first pattern; and
    correlating the trim rate of the second pattern to a trim rate of the first pattern to control the trim rate of the first pattern during the trimming process.

* * * * *